(12) United States Patent
Roh et al.

(10) Patent No.: US 12,041,810 B2
(45) Date of Patent: Jul. 16, 2024

(54) DISPLAY DEVICE INCLUDING REAR SURFACE METAL DEPOSITION FILM

(71) Applicant: LG Display Co., Ltd., Seoul (KR)

(72) Inventors: Woo-Seok Roh, Paju-si (KR); Moon-Goo Kim, Paju-si (KR); Eui-Jun Lee, Paju-si (KR); Chan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 17/123,448

(22) Filed: Dec. 16, 2020

(65) Prior Publication Data

US 2021/0202901 A1    Jul. 1, 2021

(30) Foreign Application Priority Data

Dec. 31, 2019   (KR) .................. 10-2019-0179641

(51) Int. Cl.
*H10K 50/84*   (2023.01)
*H10K 50/80*   (2023.01)
(Continued)

(52) U.S. Cl.
CPC ....... *H10K 50/844* (2023.02); *H10K 50/8426* (2023.02); *H10K 50/868* (2023.02); *H10K 59/40* (2023.02); *G02F 1/133331* (2021.01); *G02F 1/133528* (2013.01); *G09G 2330/04* (2013.01); *H01L 27/14678* (2013.01); *H10K 50/15* (2023.02); *H10K 50/16* (2023.02); *H10K 50/17* (2023.02); *H10K 50/171* (2023.02);
(Continued)

(58) Field of Classification Search
CPC ............. H01L 51/5253; H01L 51/5246; H01L 51/5293; H01L 51/0096; H01L 51/529; H01L 51/52; H01L 51/5092; H01L 51/5088; H01L 51/5056; H01L 51/5072; H01L 51/0097; H01L 2251/5338; H01L 2251/301; H01L 27/323; H01L 27/32; H01L 27/14678; H01L 27/3211; G02F 1/1652; G02F 1/133528; G02F 1/133331; G09G 2300/04; G06F 1/1652; H10K 50/844; H10K 50/8426; H10K 50/868; H10K 50/15; H10K 50/16; H10K 50/17; H10K 50/171; H10K 50/87; H10K 50/80; H10K 59/40; H10K 59/35; H10K 59/00; H10K 77/111; H10K 77/10; H10K 2102/111; H10K 2102/311
See application file for complete search history.

(56) References Cited

U.S. PATENT DOCUMENTS 10,691,246 B2 *   6/2020   Yoo .................. H10K 50/87
11,309,370 B1 *   4/2022   Brown .............. H01L 27/3244
(Continued)

FOREIGN PATENT DOCUMENTS

CN       106847084 A  *  6/2017  ............ G09F 9/301
KR    10-2014-0019699 A    2/2014
(Continued)

*Primary Examiner* — Ida M Soward
(74) *Attorney, Agent, or Firm* — Seed IP Law Group LLP

(57) ABSTRACT

A display device includes a cover window and a display module bonded to the cover window at a front side of the display module. The display module also includes a display panel. The display device includes a metal deposition film formed on a rear surface and side surfaces of the display module.

16 Claims, 4 Drawing Sheets

(51) Int. Cl.
H10K 50/842 (2023.01)
H10K 50/844 (2023.01)
H10K 50/86 (2023.01)
H10K 59/40 (2023.01)
G02F 1/1333 (2006.01)
G02F 1/1335 (2006.01)
H01L 27/146 (2006.01)
H10K 50/15 (2023.01)
H10K 50/16 (2023.01)
H10K 50/17 (2023.01)
H10K 59/35 (2023.01)
H10K 77/10 (2023.01)
H10K 102/00 (2023.01)

(52) U.S. Cl.
CPC ............ *H10K 59/35* (2023.02); *H10K 77/111* (2023.02); *H10K 2102/00* (2023.02); *H10K 2102/311* (2023.02)

(56) References Cited

U.S. PATENT DOCUMENTS

| | | | | |
|---|---|---|---|---|
| 2009/0061166 | A1* | 3/2009 | Ayukawa | G02F 1/133308 428/203 |
| 2009/0322214 | A1* | 12/2009 | Lee | H01L 51/524 445/24 |
| 2011/0050657 | A1* | 3/2011 | Yamada | H10K 59/18 361/679.01 |
| 2014/0104185 | A1* | 4/2014 | Hu | G06F 3/04164 345/173 |
| 2014/0168864 | A1* | 6/2014 | Lin | G02F 1/133308 361/679.01 |
| 2014/0267952 | A1* | 9/2014 | Sirois | G02B 1/10 156/60 |
| 2015/0017393 | A1* | 1/2015 | Oh | B32B 3/06 428/177 |
| 2015/0153610 | A1* | 6/2015 | Watanabe | H04N 5/64 349/60 |
| 2015/0249485 | A1* | 9/2015 | Ouyang | H01Q 9/42 455/552.1 |
| 2015/0261033 | A1* | 9/2015 | Shin | G02F 1/133308 29/428 |
| 2015/0340646 | A1* | 11/2015 | Shin | H01L 51/5237 257/40 |
| 2016/0113135 | A1* | 4/2016 | Kim | H04M 1/185 361/679.01 |
| 2016/0165697 | A1* | 6/2016 | Jang | G06F 3/0412 313/511 |
| 2016/0261302 | A1* | 9/2016 | An | H04B 1/3888 |
| 2017/0026500 | A1* | 1/2017 | Chung | H04M 1/185 |
| 2017/0062756 | A1* | 3/2017 | Ahn | H10K 50/84 |
| 2017/0079150 | A1* | 3/2017 | Do | G02F 1/133308 |
| 2017/0309843 | A1* | 10/2017 | Kim | B32B 7/12 |
| 2017/0324060 | A1* | 11/2017 | Kim | B32B 7/12 |
| 2018/0084680 | A1* | 3/2018 | Jarvis | H05K 1/148 |
| 2018/0088631 | A1* | 3/2018 | Park | G06F 3/041 |
| 2018/0146564 | A1* | 5/2018 | Wang | H05K 5/0017 |
| 2018/0166772 | A1* | 6/2018 | Wei | H01Q 1/44 |
| 2018/0348904 | A1* | 12/2018 | Noma | G06F 3/0443 |
| 2019/0073001 | A1* | 3/2019 | Kim | G06F 3/0412 |
| 2019/0302953 | A1* | 10/2019 | Lee | H01L 51/0097 |
| 2020/0136069 | A1* | 4/2020 | Paek | B32B 17/06 |
| 2020/0192431 | A1* | 6/2020 | Shin | G06F 1/1656 |
| 2020/0196496 | A1* | 6/2020 | Shin | H05K 5/03 |
| 2020/0201033 | A1* | 6/2020 | Song | G02B 5/045 |
| 2020/0203672 | A1* | 6/2020 | Kuon | G06F 1/1652 |
| 2021/0109398 | A1* | 4/2021 | Son | G06F 1/1656 |
| 2022/0272881 | A1* | 8/2022 | Shin | H05K 5/0017 |

FOREIGN PATENT DOCUMENTS

| | | | | |
|---|---|---|---|---|
| KR | 10-2015-0031642 A | | 3/2015 | |
| KR | 20170079968 A | * | 7/2017 | .......... G02F 1/1333 |
| KR | 20180036899 A | * | 4/2018 | ......... H01L 27/3223 |
| WO | WO-2017045349 A1 | * | 3/2017 | .......... G02F 1/1333 |
| WO | WO-2018193953 A1 | * | 10/2018 | .......... G02F 1/1333 |
| WO | WO-2018225603 A1 | * | 12/2018 | .......... G06F 3/0443 |

* cited by examiner

DISPLAY DEVICE INCLUDING REAR SURFACE METAL DEPOSITION FILM

CROSS-REFERENCE TO RELATED APPLICATIONS

This application claims the benefit under 35 U.S.C. § 119(a) of Korean Patent Application No. 10-2019-0179641, filed Dec. 31, 2019, in the Korean Intellectual Property Office, which is incorporated herein by reference in its entirety.

BACKGROUND

Technical Field

The present disclosure relates to a display device.

Discussion of the Related Art

Recently, flat panel display devices having excellent characteristics such as thinness, weight reduction, and low power consumption have been widely developed and applied to various fields.

Among the flat panel display devices, an organic light-emitting display (OLED) device, which is also referred to as an organic electroluminescent display device or an organic electro photoluminescence display device, is a device in which charges are injected into a light-emitting layer formed between a negative electrode, which is an electron injection electrode, and a positive electrode, which is a hole injection electrode, and electrons and holes form pairs and then are combined to emit light.

Recently, the OLED devices having flexible characteristics capable of being curved or bent have been used, and flexible display devices may be formed such that at least one edge portion thereof has a round shape of a predetermined curvature.

In the display device with such a structure, in a state in which a display module is bonded to a cover window having an edge portion of a round shape, a heat dissipation film is bonded to a rear side of the display module.

Owing to the limitation of the current bonding technique in known display devices, the heat dissipation film cannot be bonded to a side surface of the display module, and thus a side surface of the edge portion is in a state of being exposed. In particular, the heat dissipation film is not bonded to the side surface of the edge portion of the round shape.

Meanwhile, static electricity generated in the cover window causes an induction discharge in the vicinity of the edge portion so that fixed charges are generated in the edge portion of the display module.

The fixed charges flow in through the exposed side surface of the edge portion of the display module such that, when the display module is driven, a driving failure may occur in the edge portion and cause poor image quality. For example, greenish defects may occur in the edge portion, and thus image quality may be degraded.

BRIEF SUMMARY

Embodiments relate to measures of reducing an image quality defect in an edge portion due to static electricity.

One or more embodiments relate to a display device including a cover window, a display module including a display panel and bonded to the cover window at a front side, and a metal deposition film formed on a rear surface and side surfaces of the display module.

Here, the metal deposition film may include a metal film made of copper.

The metal deposition film may further include another metal film made of chrome and nickel, and the metal film made of copper may be formed on a surface of the another metal film made of chrome and nickel.

A thickness of the metal film made of copper may range from 2000 Å (angstroms) to 3000 Å.

The display module may further include a circuit film connected to the display panel on one side surface of the display module, and the metal deposition film formed on one side surface of the display module may include a hole which exposes a connection portion between the display panel and the circuit film and a peripheral region of the connection portion.

The metal deposition film may be formed to be grounded.

Each of the cover window and the display module may have a structure in which an edge portion on at least one side is bent to a rear side in a round shape.

The display module may further include at least one of a touch panel and a polarizing plate which are modularized with the display panel.

The display panel may include a pixel region including a light-emitting diode.

The display device may further include an optical adhesive member configured to bond the display module to the cover window.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
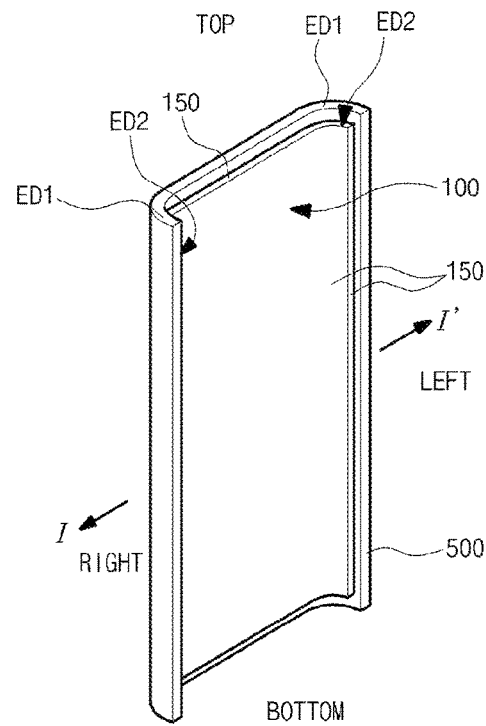
FIG. 1 is a schematic perspective view illustrating an organic light-emitting display (OLED) device according to an embodiment of the present disclosure.

Advantages and features of the present disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts may be located between the two parts.

In describing a temporal relationship, for example, when a temporal predecessor relationship is described as being "after," "subsequent," "next to," "prior to," or the like, unless "immediately" or "directly" is not used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing components of the specification, the terms first, second, A, B, (a), (b), and the like can be used. These terms are intended to distinguish one component from other components, but the nature, sequence, order, or number of the components is not limited by those terms. When components are disclosed as being "connected," "coupled," or "in contact" with other components, the components can be directly connected or in contact with the other components, but it should be understood that another component(s) could be "interposed" between the components and the other components or could be "connected," "coupled," or "contacted" therebetween.

In the specification, a "display device" may include display devices in a narrow sense, such as liquid crystal modules (LCMs), OLED modules, and quantum dot (QD) modules, and the like which include display panels and drivers for driving the display panels. In addition, the display device may also include laptop computers, televisions, and computer monitors which are complete products or final products including LCMs, OLED modules, QD modules, or the like, equipment displays including automotive displays or other types of vehicles, and set electronic devices, set devices, or set apparatuses such as mobile electronic devices such as smartphones or electronic pads.

Thus, the display device in the specification may include display devices in a narrow sense, such as LCMs, OLED modules, QD modules, or the like, and application products or set devices which are end consumer devices, which include the LCMs, the OLED modules, the QD modules, or the like.

In addition, in some cases, it may be separately expressed that LCMs, OLED modules, and QD modules, which include display panels and drivers, are expressed as "display devices" in some cases, and electronic devices as complete products including the LCMs, the OLED modules, or QD modules are expressed as "set devices." For example, the display device in a narrow sense may be a concept including a display panel such as a liquid crystal display (LCD) panel, an OLED panel, or a QD display panel, and a source printed circuit board (PCB) which is a controller for driving the display panel, and the set device may be a concept further including a set PCB which is a set controller which is electrically connected to the source PCB to control an entirety of the set device.

The display panel used in the present embodiment may employ all types of display panels such as a liquid crystal display panel, an OLED panel, a QD display panel, an electroluminescent display panel, and the like. However, the present disclosure is not limited to a specific display panel of which a bezel may be bent with a flexible substrate for an OLED panel of the present embodiment and a backplane support structure below the flexible substrate. In addition, the display panel used in the display device according to an embodiment of the specification is not limited to a shape or size of the display panel.

For example, when the display panel is an OLED panel, the display panel may include a plurality of gate lines, a plurality of data lines, and a plurality of pixels formed in intersection regions between the gate lines and the data lines. In addition, each of the pixels may include an array including a thin film transistor (TFT) which is an element for selectively applying a voltage to each pixel, an OLED layer on the array, and an encapsulation substrate or an encapsulation layer, which is disposed on the array to cover the OLED layer. The encapsulation layer may protect the TFT and the OLED layer from an external impact and prevent moisture or oxygen from infiltrating into the OLED layer. In addition, a layer formed on the array may include an inorganic light emitting layer, e.g., a nano-sized material layer or a quantum dot.

Hereinafter, embodiments of the present disclosure will be described in detail with reference to the accompanying drawings.

Figure 2:
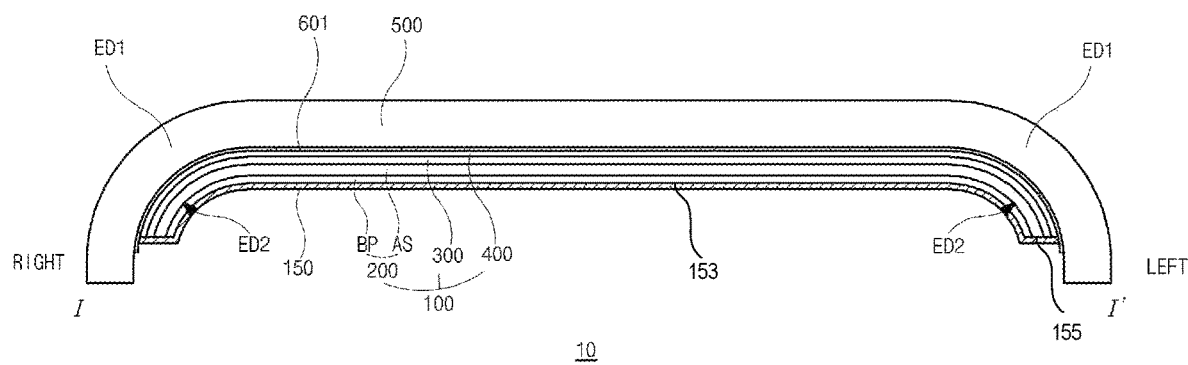
FIG. 2 is a cross-sectional view illustrating the OLED device of FIG. 1 cut in a left-right direction along line I-I' in FIG. 1.

FIG. 1 is a schematic perspective view illustrating an OLED device according to an embodiment of the present disclosure, and FIG. 2 is a cross-sectional view illustrating the OLED device of FIG. 1 cut in a left-right direction along line I-I' in FIG. 1. In FIGS. 1 and 2, for convenience of description, an example of an OLED device 10 having a quadrangular shape in a planar view and having a structure in which both edge portions are bent in a round shape is illustrated. In addition, terms top, bottom, left, and right are added based on a direction when viewed from a front side of the OLED device 10.

Referring to FIGS. 1 and 2, the OLED device 10 according to the present embodiment may include a display module 100 and a cover window 500 located in front of the display module 100. The cover window 500 may be a cover glass or a cover member.

The cover window 500 may correspond to a component substantially located at the forefront of the OLED device 10 and may serve to protect the display module 100 disposed behind the cover window 500.

The display module 100 may be bonded to a rear surface of the cover window 500 through an adhesive member 601.

The adhesive member 601 for bonding the display module 100 to the cover window 500 is an optical adhesive member having a high transmittance characteristic. For example, an optically clear adhesive (OCA) may be used as the adhesive member 601, but the present disclosure is not limited thereto.

Meanwhile, the OLED device 10 of the present embodiment may be a display device having a flexible characteristic and may be formed to have a so-called bending edge structure in which an edge portion located at an edge of at least one side is bent in a round shape toward a rear side. In the present embodiment, an example in which two opposite sides, e.g., left and right edge portions, are formed in a bent structure, and the remaining two opposite sides, e.g., upper and lower edge portions, are formed in a flat structure which is not bent will be described.

Thus, the cover window 500 which substantially defines an exterior of the OLED device 10 may be formed to have a bending edge structure.

The display module 100 bonded to the cover window 500 may include a display panel 200 for displaying an image.

In addition, for example, the display module 100 may include a touch panel 300, a polarizing plate 400, and the like as other components modularized together with the display panel 200.

The display panel 200 may include a plurality of pixel regions disposed in the form of a matrix to display an image.

The display panel 200 may include an array substrate (or thin-film-transistor (TFT) substrate AS in which array elements including a TFT transistor, which is a drive element, and a light-emitting diode, which is a display element, are formed, and a back plate BP for supporting a rear side of the array substrate AS.

Figure 3:
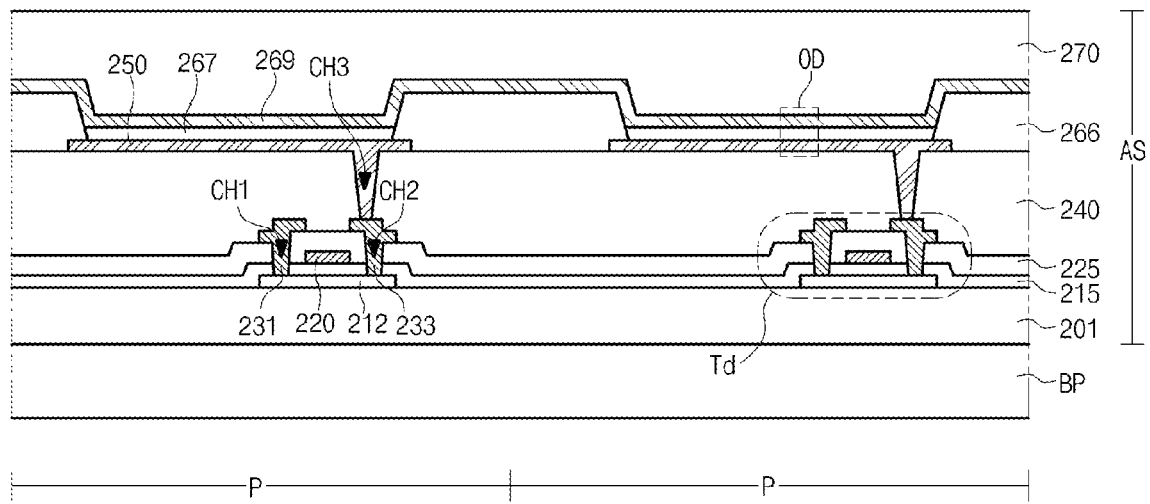
FIG. 3 is a schematic cross-sectional view illustrating a structure of a display panel according to an embodiment of the present disclosure.

Such a structure of the display panel 200 will be described in more detail with reference to FIG. 3. FIG. 3 is a schematic cross-sectional view illustrating the structure of the display panel according to an embodiment of the present disclosure.

In FIG. 3, for convenience of description, an example of a top emission type display panel 200 in which light is emitted in an upward direction of a substrate 201 and an image is displayed is illustrated. Meanwhile, a bottom emission type display panel in which light is emitted in a downward direction of the substrate 201 may be used as the display panel 200 of the present embodiment.

Referring to FIG. 3, a plurality of TFTs each including a switching TFT (not shown) and a drive TFT Td in each pixel region P, and a light-emitting diode OD located on the TFT transistor and connected to the drive TFT Td may be disposed the substrate 201 of the display panel 200.

In order to allow the display panel 200 to have a flexible characteristic, the substrate 201 may be formed of a plastic substrate having a flexible characteristic. In this regard, for example, the substrate 201 may be formed of a polymer plastic material such as polyimide (PI), polyethylene naphthalate (PEN), polyethylene terephthalate (PET), or the like, but the present disclosure is not limited thereto.

Since the substrate 201 is formed of the above plastic material, the substrate 201 may be bent, as necessary.

A semiconductor layer 212 may be formed on the substrate 201. The semiconductor layer 212 may be made of polycrystalline silicon or an oxide semiconductor material, but the present disclosure is not limited thereto.

A gate insulating film 215 may be formed on the semiconductor layer 212 as an insulating film made of an insulating material.

The gate insulating film 215 may be formed of an inorganic insulating material, e.g., silicon oxide ($SiO_2$) or silicon nitride ($SiN_x$), but the present disclosure is not limited thereto.

A gate electrode 220 made of a conductive material such as a metal may be formed on the gate insulating film 215 to correspond to a central region of the semiconductor layer 212.

In addition, a gate line connected to a gate electrode of the switching TFT may be formed on the gate insulating film 215.

An interlayer insulating film 225 may be formed on the gate electrode 220 as an insulating film made of an insulating material.

The interlayer insulating film 225 may be formed of an inorganic insulating material such as $SiO_2$ or $SiN_x$, or an organic insulating material such as benzocyclobutene or photo acryl, but the present disclosure is not limited thereto.

The interlayer insulating film 225 may include a first contact hole CH1 and a second contact hole CH2 which expose both sides of the semiconductor layer 212.

The first contact hole CH1 and the second contact hole CH2 may be located at the both sides of the gate electrode 220 to be spaced apart from the gate electrode 220. In addition, the first contact hole CH1 and the second contact hole CH2 may also be formed in the gate insulating film 215.

A source electrode 231 and a drain electrode 233 each made of a conductive material such as a metal may be formed on the interlayer insulating film 225.

In addition, a data line which crosses the gate line and is connect to a source electrode of the switching TFT may be formed on the interlayer insulating film 225.

The source electrode 231 and the drain electrode 233 may be located to be spaced apart from each other based on the gate electrode 220 and may be in contact with the both sides of the semiconductor layer 212 through the first contact hole CH1 and the second contact hole CH2.

The semiconductor layer 212, the gate electrode 220, the source electrode 231, and the drain electrode 233, which are formed as described above, may constitute the drive TFT Td.

In the above description, an example in which the drive TFT Td is formed in a coplanar structure has been described.

As another example, the drive TFT Td may have an inverted staggered structure in which a gate electrode is located below a semiconductor layer and in which a source electrode and a drain electrode are located above the semiconductor layer. In this case, for example, the semiconductor layer may be made of amorphous silicon.

Meanwhile, although not shown in the drawings, the switching TFT may be formed in the same structure as the drive TFT Td.

A protective layer 240 may be formed on the source electrode 231 and the drain electrode 233 as an insulating film made of an insulating material. The protective layer 240 may be formed of a single layer structure or a multilayer structure.

In the case of the single layer structure, the protective layer 240 may be formed of an inorganic insulating material or an organic insulating material. In addition, in the case of the multilayer structure, the protective layer 240 may be formed using at least one of an inorganic insulating material and an organic insulating material.

Here, $SiO_2$ or $SiN_x$ may be used as an inorganic insulating material of the protective layer 240, and benzocyclobutene or photo acryl may be used as an organic insulating material of the protective layer 240, but the present disclosure is not limited thereto.

Meanwhile, in the present embodiment, for convenience of description, a case in which the protective layer 240 of a single layer structure is formed will be described.

A drain contact hole CH3 exposing the drain electrode 233 may be formed in the protective layer 240.

A first electrode 250 individually formed in each pixel region P may be formed on the protective layer 240. The first electrode 250 may be formed to be connected to the drain electrode 233 through the drain contact hole CH3.

When the top emission type display panel 200 is used, the first electrode 250 may be formed of a metal material having an excellent reflective characteristic. In this regard, for example, the first electrode 250 may be formed of a metal material such as Al, Ag, Ti, or an Al—Pd—Cu (APC) alloy, but the present disclosure is not limited thereto.

A bank (or partition wall) 266 surrounding each pixel region P may be formed on the first electrode 250 along a boundary of each pixel region P.

The bank 266 may include an opening which exposes the first electrode 250 and may be formed to cover an edge of the first electrode 250.

An organic light-emitting layer 267 may be formed on the first electrode 250 which is exposed through the opening of the bank 266.

The organic light-emitting layer 267 may be formed in a unit of the pixel region P or may be continuously formed to substantially correspond to all the pixel regions P along an entire surface of a display region of the substrate 201. In the present embodiment, an example in which the organic light-emitting layer 267 is formed in a unit of the pixel region P will be described.

The organic light-emitting layer 267 may be formed in a multilayer structure including a light-emitting material layer. For example, the organic light-emitting layer 267 may include a hole injection layer, a hole transport layer, a light-emitting material layer, an electron transport layer, and an electron injection layer.

The organic light-emitting layer 267 may be formed to emit a color which is exhibited in a corresponding pixel region P. For example, the organic light-emitting layer 267 emitting a red color, a green color, or a blue color may be formed in a red, green, or blue pixel region P.

A second electrode 269 may be formed on the organic light-emitting layer 267. In the case of the top emission type display panel 200, the second electrode 269 may be formed as a transparent electrode having a transparent characteristic. For example, the second electrode 269 may be formed of a transparent conductive material such as indium tin oxide (ITO), indium zinc oxide (IZO), or indium tin zinc oxide (ITZO).

Meanwhile, in the case of implementing a micro cavity effect, the second electrode 269 may be formed to include a transflective electrode layer having a transflective characteristic and the second electrode 269 may include the transflective electrode layer to be formed in a multilayer structure. The transflective electrode layer of the second electrode 269 may be formed of a metal material such as magnesium (Mg), silver (Ag), or an alloy of Mg and Ag, and such a metal material may be formed with a thickness thin enough to implement a transflective characteristic.

In the pixel region P, the first electrode 250, the organic light-emitting layer 267, and the second electrode 269, which are disposed as in the above description, may constitute the light-emitting diode OD. Here, one of the first and second electrodes 250 and 269 may serve as an anode and the remaining one thereof may serve as a cathode.

An encapsulation film 270 for encapsulating the substrate 201 in a state in which the second electrode 269 is formed may be formed on the second electrode 269 along the entire surface of the substrate 201. The encapsulation film 270 may serve to improve reliability by blocking moisture or oxygen from infiltrating from the outside.

The encapsulation film 270 may be formed in a single layer structure or a multilayer structure using at least one of an inorganic insulating material and an organic insulating material. Here, for example, when the encapsulation film 270 is formed in a multilayer structure, the encapsulation film 270 may be formed in a form in which an inorganic encapsulation film and an organic encapsulation film are alternately stacked.

The array substrate AS may be formed to include the above components.

Meanwhile, the back plate BP may be disposed at the rear side of the array substrate AS to support and protect a rear surface of the array substrate AS.

For example, the back plate BP may be bonded to a surface of the rear side, that is, a rear surface of the substrate 201 through an adhesive member (not shown).

As described above, since the back plate BP is bonded to the rear surface of the substrate 201, rigidity of the substrate 201 having a flexible characteristic may be supplemented so that a problem in which the substrate 201 is excessively bent or torn may be prevented.

In a state in which the back plate BP is bonded to the substrate 201, a process of manufacturing the array substrate AS may be performed. As another example, during the manufacturing process of the array substrate AS, a separate support substrate (or a carrier substrate) may be bonded to the array substrate AS, the support substrate may be removed after the manufacturing process is completed, and then the back plate BP may be bonded to the array substrate AS.

The back plate BP which substantially defines the flexible characteristic of the display panel 200 may be formed of a plastic material having a flexible characteristic. In this regard, for example, the back plate BP may be formed of PEN, PET, polyethylene ether phthalate, polycarbonate, polyarylate, polyether imide, polyether sulfonate, polyimide, or polyacrylate, but the present disclosure is not limited thereto.

Referring to FIGS. 1 and 2 again, in order to implement a touch function of the OLED device 10, the touch panel 300 may be provided in the display module 100 as a touch sensor.

All types of touch panels including capacitive type touch panels, pressure-sensitive type touch panels, infrared type touch panels, and ultrasonic type touch panels may be used as the touch panel 300. In addition, the touch panel 300 may have a flexible characteristic. For example, the touch panel 300 may be formed in the form of a film to have a flexible characteristic.

The touch panel 300 may be disposed to be bonded to a front surface or the rear surface of the display panel 200 through an adhesive member. In the present embodiment, an example in which the touch panel 300 is bonded to the front surface of the display panel 200 will be described.

As an example that is different from the above example, a touch sensor may not be formed in the form of a panel but may be formed in the display panel 200.

Meanwhile, in order to reduce reflection of the OLED device 10 with respect to external light, the polarizing plate 400 may be provided in the display module 100. In order to implement reduction in reflection with respect to external light, the polarizing plate 400 may be formed as a circular-shaped polarizing plate. Such a polarizing plate 400 may be formed in the form of a film to have a flexible characteristic.

When the touch panel 300 is bonded to the front surface of the display panel 200, the polarizing plate 400 may be attached to a front surface of the touch panel 300 through an adhesive member.

As another example, the polarizing plate 400 may be bonded to the front surface of the display panel 200, and the touch panel 300 may be bonded to a front surface of the polarizing plate 400 or bonded to the rear surface of the display panel 200.

All of the display panel 200, the touch panel 300, and the polarizing plate 400 may have flexible characteristics so that the display module 100 formed of the display panel 200, the touch panel 300, and the polarizing plate 400, which are modularized, may have a flexible characteristic.

The flexible display module 100 has a substantially entirely flat (or planar) shape before being bonded to the cover window 500.

The flat-shaped display module 100 may be relatively moved toward the cover window 500 of a bending edge structure to be directly connected to a rear surface of the cover window 500.

When coupled as described above, the shape of the flexible display module 100 is deformed along a surface shape of the cover window 500.

For example, a shape of an edge portion ED2 of the display module 100 located to correspond to an edge portion ED1, which is bent in a round shape of the cover window 500, may be deformed to have a bending edge structure of the same round shape.

As described above, the flexible display module 100 is coupled to the cover window 500 so that the OLED device 10 having a bending edge structure may be manufactured.

In the OLED device 10, most of static electricity charged to the cover window 500 due to friction or the like is present in an edge portion, which is a corner portion, and the static electricity causes induction discharge in the vicinity of the edge portion so that fixed charges may be generated even in the edge portion ED2 of the display module 100.

When the generated charges are introduced into the display panel 200 of the display module 100, a drive failure occurs in an edge portion of the display panel 200 so that a greenish defect may occur in the edge portion.

For example, the greenish defect due to the introduced charges may occur in not only left and right edge portions which are bent edge portions, but also top and bottom edge portions which are flat edge portions that are not bent.

In the present embodiment, in order to reduce the defect due to the introduced charges, a metal deposition film 150 may be formed on the display module 100 using, for example, Cu as a low-resistance metal material.

For example, after the display module 100 is manufactured, a sputtering process is performed to form the metal deposition film 150 on the rear surface of the display module 100 and four top, bottom, left, and right side surfaces which are the entire side surface of the display module 100. As described above, the metal deposition film 150 formed on the rear surface 153 and the side surfaces 155 of the display module 100 may be continuously formed in an integral shape by a sputtering process and thus may serve as a single electrode electrically.

In addition, the metal deposition film 150 may be formed to be grounded. For example, the metal deposition film 150 may be formed to be electrically connected to a ground terminal provided in the OLED device 10.

Since the metal deposition film 150 may be formed along the side surfaces of the display module 100, charges induced to the edge portions of the display module 100 due to static electricity may be distributed and discharged along the metal deposition film 150 serving as a discharge electrode.

Since the charge induced in the edge portions may be prevented from being introduced into the display panel 200 through the side surfaces of the display module 100, an image quality defect such as a greenish defect due to the introduction of charges may be effectively reduced.

When compared with a case of using a conventional heat dissipation film formed of a metal material, in the conventional case, due to the limitation of bonding technique of the heat dissipation film, the heat dissipation film cannot be bonded to a side surface of a display module. In particular, in a display module with a bending edge structure, due to a shape factor of a bent form, the heat dissipation film is not bonded to the side surface of the display module 100. Consequently, all side surfaces are in an exposed state without being covered with the heat dissipation film, and thus charges of an edge portion are introduced into the display panel through the exposed side surfaces so that an image quality defect may occur.

Meanwhile, according to the present embodiment, the metal deposition film 150 is formed through a sputtering process so that the metal deposition film 150 may be formed on even a side surface. Thus, charges may be blocked from being introduced through the side surface so that an image quality defect due to the introduction of charges may be reduced.

In addition, the metal deposition film 150 may be formed of a metal material to have a heat dissipation characteristic. For example, when the metal deposition film 150 containing Cu having high thermal conductivity is used, an excellent heat dissipation characteristic may be achieved.

As described above, since the metal deposition film 150 has a heat dissipation characteristic, heat generated when the display module 100 is driven may be effectively distributed and discharged.

In particular, since the metal deposition film 150 is formed on the side surface of the display module 100 as well as the rear surface thereof, a heat dissipation area may be maximized so that the heat dissipation characteristic may also be maximized.

The metal deposition film 150 will be described in more detail below with reference to other accompanying drawings.

Figure 4:
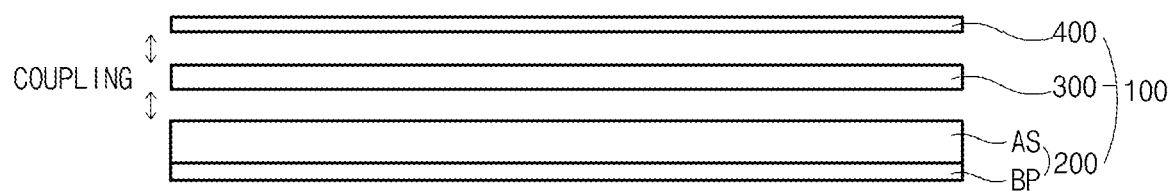
FIG. 4 is a diagram illustrating a process of manufacturing a display module according to an embodiment of the present disclosure.
Figure 5:
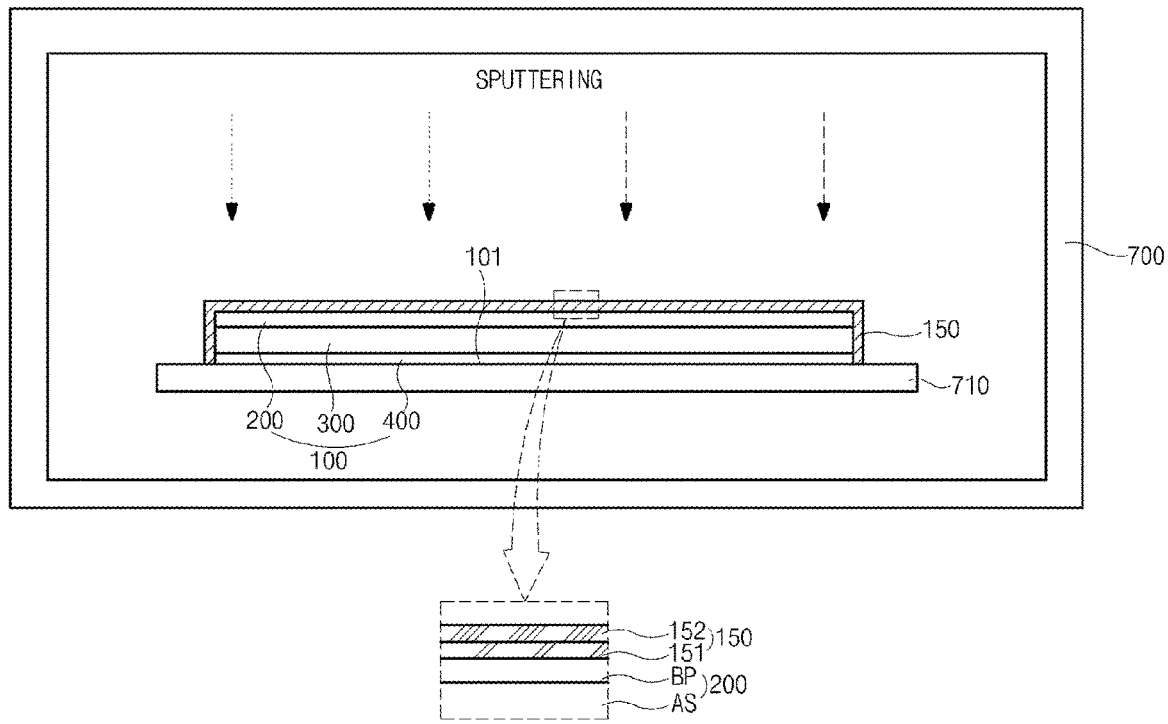
FIG. 5 is a diagram illustrating a process of forming a metal deposition film on the display module according to an embodiment of the present disclosure.
Figure 6:
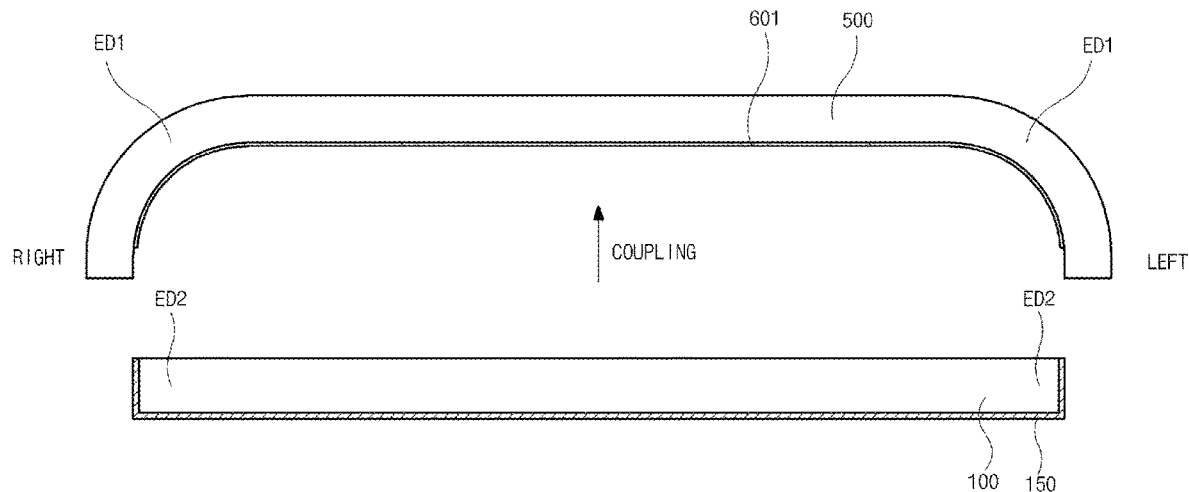
FIG. 6 is a diagram illustrating a process of coupling the display module and a cover window according to an embodiment of the present disclosure.

FIGS. 4 to 6 are schematic diagrams illustrating a process of manufacturing the OLED device according to an embodiment of the present disclosure. FIG. 4 is a diagram illustrating a process of manufacturing the display module, and FIG. 5 is a diagram illustrating a process of forming the metal deposition film on the display module. FIG. 6 is a diagram illustrating a process of coupling the display module and the cover window.

Figure 7:
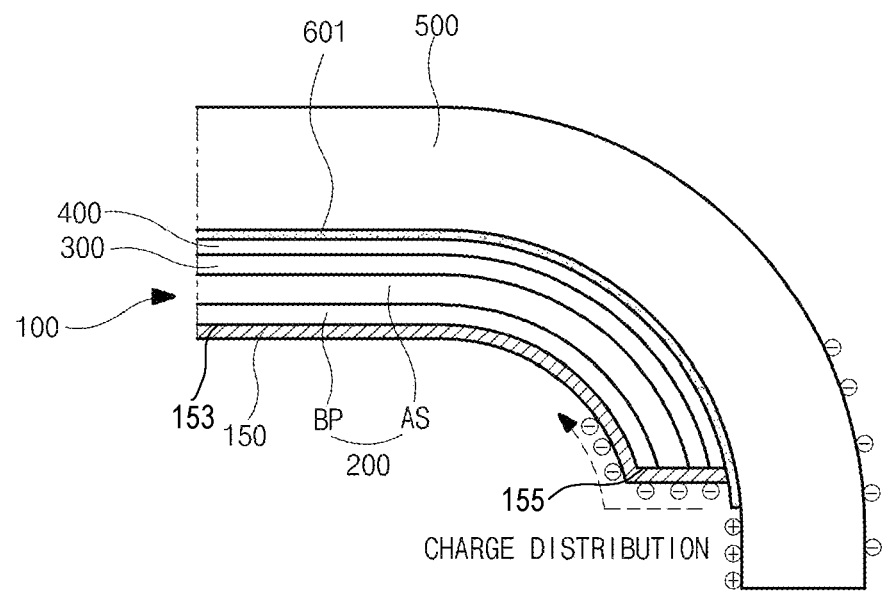
FIG. 7 is a schematic diagram illustrating that induction charges due to static electricity are discharged through the metal deposition film in the OLED device according to an embodiment of the present disclosure.

FIG. 7 is a schematic diagram illustrating that induction charges due to static electricity are discharged through the metal deposition film in the OLED device according to an embodiment of the present disclosure and, for convenience of description, shows a bent edge portion.

First, referring to FIG. 4, after the flexible display panel 200 including the back plate BP and the array substrate AS bonded to the front side of the back plate BP is manufactured, the display panel 200 is coupled to the touch panel 300 and the polarizing plate 400 so that the display module 100 of the modularized structure may be manufactured.

The display panel 200, the touch panel 300, and the polarizing plate 400 may be bonded to each other through an adhesive member.

Referring to FIGS. 5 and 7, a sputtering process may be performed on the display module 100, and thus the metal deposition film 150 may be formed on the rear surface 153 and the side surfaces 155 of the display module 100.

For example, the display module 100 may be put into sputtering equipment 700 to be seated on a stage 710. In this case, a front side surface 101 which is a display surface of the display module 100 is seated to be pressed against the stage 710.

After the display module 100 is seated on the stage 710, a process of forming the metal deposition film 150 on the display module 100 may be performed.

In this regard, first, in order to increase a deposition characteristic of the metal deposition film 150 with respect to the display module 100, a plasma treatment operation may be performed as a pretreatment operation of modifying an exposed surface of the display module 100.

After the plasma treatment operation, a sputtering process of forming the metal deposition film 150 may be performed.

Here, the metal deposition film 150 may be formed in a double-layer structure and may include a first metal film 151 which is primarily deposited and a second metal film 152 which is deposited on a surface of the first metal film 151.

In this regard, the second metal film 152 corresponds to a component which implements a discharge characteristic and a heat dissipation characteristic of the metal deposition film 150 and may be made of a metal material, for example, Cu, having low resistance and high thermal conductivity. However, Cu may be somewhat insufficient in bonding strength with respect to a surface of the display module 100.

In order to supplement the bonding strength of the second metal film 152, the first metal film 151 made of a metal material having higher bonding strength with respect to the display module 100 than the second metal film 152 may be formed first.

For example, the first metal film 151 may be made of nickel (Ni) and chromium (Cr).

As described above, the first metal film 151 having excellent bonding strength may be deposited and formed on the rear surface 153 and the side surfaces 155 of the display module 100, which are the exposed surfaces, through a first sputtering process. (See FIG. 7)

After the first metal film 151 is formed, a second sputtering process may be performed to deposit and form the second metal film 152 on the first metal film 151.

In order to effectively implement discharge and heat dissipation functions, the second metal film 152 made of Cu may be formed in a predetermined thickness range, for example, ranging from about 2000 Å to 3000 Å.

Thus, the metal deposition film 150 formed of the first and second metal films 151 and 152 may be formed to cover the surface of the display module 100.

Next, referring to FIG. 6, the display module 100 in a state in which the metal deposition film 150 is formed may be coupled to the cover window 500.

For example, the adhesive member 601 such as an OCA may be formed on the rear surface of the cover window 500 before bonding, and the display module 100 may be relatively moved toward the cover window 500 to be pressed thereagainst. Consequently, the display module 100 may be fixed and coupled to the cover window 500 through the adhesive member 601.

Meanwhile, the cover window 500 may be formed in a bending edge structure. For example, referring to FIGS. 1 and 2, an edge portion ED1 including a left side surface of the OLED device 10 and an edge portion ED1 including a right side surface thereof may be formed to have a structure which is bent to the rear side in a round shape.

Before being bonded to the cover window 500, the display module 100 may have a generally flat shape. Since the display module 100 may be formed to have a flexible characteristic, when the display module 100 is coupled to the cover window 500, the shape of the display module 100 may be deformed according to the shape of the cover window 500.

In this regard, as shown in FIGS. 1 and 2, after the flat-shaped display module 100 before coupling is coupled to the cover window 500, left and right edge portions ED2 of the flat-shaped display module 100, which are located to correspond to the bent left and right edge portions ED1 of the cover window 500, may each be deformed to have a round-shaped bent form.

As described above, the flexible display module 100 is coupled to the cover window 500 so that the OLED device 10 having a bending edge structure may be manufactured.

In the OLED device 10 which is formed as described above, the metal deposition film 150 performing discharge and heat dissipation functions may be directly formed on the rear surface 153 and the side surfaces 155 of the display module 100.

As described above, as shown in FIG. 7, since the metal deposition film 150 is formed on even the side surface 155 of the display module 100, even when charges are induced to the edge portion of the display module 100 due to static electricity generated in the edge portion of the cover window 500, the induced charges may be distributed along the metal deposition film 150 deposited on the side surface 155 and the rear surface of the display module 100 to be discharged to the outside.

Thus, when the side surface of the edge portion of the display module 100 is exposed as in the related art, charges may be blocked from being introduced into the display panel 200 through the exposed side surface of the edge portion.

Accordingly, a drive failure in the edge portion of the display panel 200 due to the introduction of charges may be prevented. Consequently, an image quality defect such as a greenish defect may be effectively reduced.

Meanwhile, the display module 100 according to the present embodiment may include a flexible circuit film which is bonded to the display panel 200. As described above, when the circuit film is provided, the metal deposition film 150 may not be formed in a partial region of a corresponding side surface of the display module 100, which is a peripheral region to which the circuit film is bonded. This is to prevent the metal deposition film 150 from being electrically shorted to the circuit film or to a connection portion between the circuit film and the display panel 200.

Figure 8:
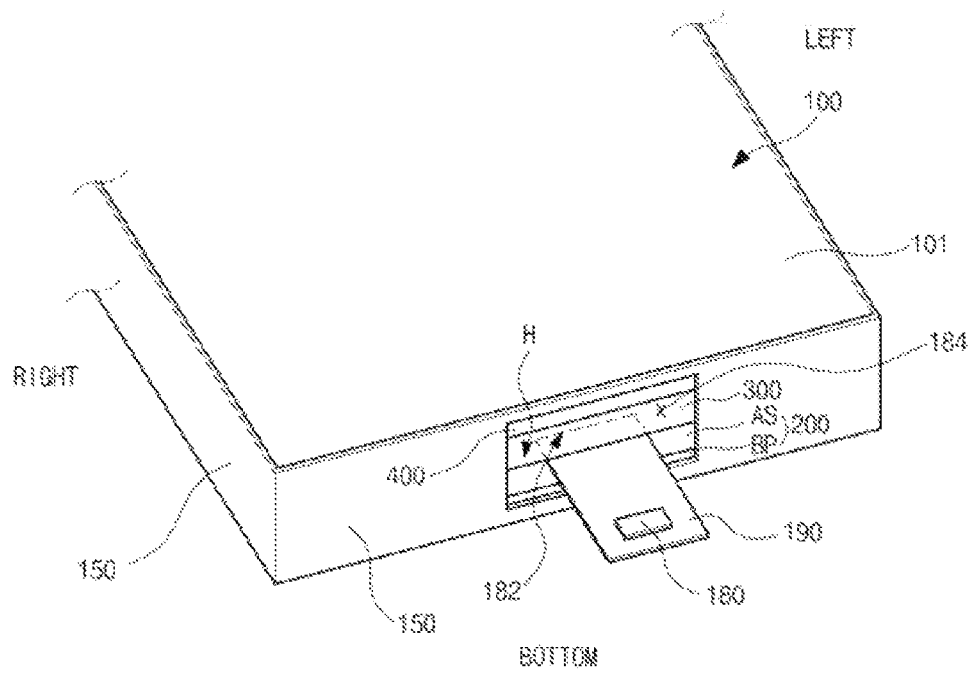
FIG. 8 is a schematic diagram illustrating a display module equipped with a circuit film according to an embodiment of the present disclosure.

This will be further described below with reference to FIG. 8. FIG. 8 is a schematic diagram illustrating the display module equipped with the circuit film according to an embodiment of the present disclosure. For convenience of description, FIG. 8 illustrates the side surface of the display module 100 to which a circuit film 190 is bonded before being coupled to the cover window 500.

Referring to FIG. 8, a drive circuit 180 may be mounted on the circuit film 190, and the circuit film 190 may be connected to a lower edge portion by a connection portion 182, for example, an edge portion of one side of the display panel 200. Signal input pads electrically connected to the circuit film 190 may be formed in the lower edge portion of the array substrate AS of the display panel 200.

As described above, with respect to a lower side surface which is one side surface of the display module 100 to which the circuit film 190 is bonded and connected, when the metal deposition film 150 is deposited on an entirety of the lower side surface, there may occur a problem in that the metal deposition film 150 is electrically shorted to the circuit film 190 or the signal input pads of the display panel 200.

In order to prevent the electrical short circuit, in the lower side surface, the metal deposition film 150 may not be deposited on the connection portion 182 to which the circuit film 190 is bonded and a peripheral region 184 surrounding the connection portion 182 and may be deposited on another region different from the peripheral region.

The metal deposition film 150 may be formed to have a hole H which exposes the connection portion 182 to which the circuit film 190 is bonded and the peripheral region 184, and a region corresponding to the hole H corresponds to the region in which the metal deposition film 150 is not deposited.

As described above, the metal deposition film 150 is formed in a form having the hole H with respect to the side surface of the display module 100 in which the circuit film 190 is located so that the metal deposition film 150 may be prevented from being electrically shorted to the circuit film 190 or the display panel 200.

Meanwhile, in connection with the deposition of the metal deposition film 150 formed in a structure having the hole H, for example, after a masking film is bonded to portions in which the circuit film 190 and the hole H are formed, a sputtering process may be performed. Consequently, the metal deposition film 150 may be prevented from being deposited in the portions in which the circuit film 190 and the hole H are formed.

Table 1 below shows greenish defect evaluation results with respect to OLED devices according to a Comparative Example and Example according to the present embodiment.

TABLE 1

| Items | Metal Deposition Film | Evaluation Results (Fail/Total) | Defective Rate |
|---|---|---|---|
| Comparative Example | Not present (non-deposition) | 3/6 | 50% |
| Example | Present (deposition) | 1/5 | 20% |

Defect evaluation is evaluation using a brass rod. The defect evaluation was performed by repeatedly rubbing the brass rod on the surface of the edge portion of the cover window. In the above evaluation, a size of the brass rod was 12 mm, an action force thereof was 100 gf, a speed thereof was 100 mm/s, an evaluation time was twenty-six hours, a total number of cycles was 26000, and test images during the evaluation were images displaying a third gray scale, a sixteenth gray scale, and a thirty-second gray scale.

In addition, the display device of Comparative Example was an OLED device in which a metal deposition film was not formed.

In describing the evaluation results, in the case of the Comparative Example, greenish defects occurred in three display devices for all six display devices to be evaluated, and all these greenish defects occurred after about four hours. Therefore, a defective rate of the Comparative Example was 50%.

In the case of the Example, a greenish defect occurred in one display device for all five display devices to be evaluated, and this greenish defect occurred after about four hours. Therefore, a defective rate of the Example was 20%.

As described above, according to the present disclosure, since the metal deposition film is formed on the side surface of the edge portion of the display module, it is possible to prevent charges from being introduced into the display module through the side surfaces.

Consequently, an image quality defect caused due to the introduction of charges through the side surface of the edge portion may be effectively reduced.

Meanwhile, in the above-described embodiment, an example of the OLED device has been described, but the present disclosure is not limited thereto. All types of display devices including OLED devices and having cover windows and display modules may be employed as the display device of the present disclosure.

In addition, not only the above described display device in which at least one edge portion has a bending edge structure, but also a display device in which an entire edge portion has a flat structure may be used as the display device of the present disclosure.

The display device according to the embodiment of the present disclosure may include the cover window, the display module including the display panel and bonded to the cover window at the front side, and the metal deposition film formed on the rear surface and the side surfaces of the display module.

According to the embodiment of the present disclosure, the metal deposition film may include a metal film made of Cu.

According to the embodiment of the present disclosure, the metal deposition film may further include another metal film made of Cr and Ni, and the metal film made of Cu may be formed on the surface of the another metal film made of Cr and Ni.

According to the embodiment of the present disclosure, the thickness of the metal film made of Cu may range from 2000 Å to 3000 Å.

According to the embodiment of the present disclosure, the display module may further include the circuit film connected to the display panel on one side surface of the display module, and the metal deposition film formed on the one side surface of the display module may include the hole which exposed a connection portion between the display panel and the circuit film and a peripheral region of the connection portion.

According to the embodiment of the present disclosure, the metal deposition film may be formed to be grounded.

According to the embodiment of the present disclosure, the cover window and the display module may each have a structure in which an edge portion on at least one side is bent to the rear side in a round shape.

According to the embodiment of the present disclosure, the display module may further include at least one of the touch panel and the polarizing plate which are modularized with the display panel.

According to the embodiment of the present disclosure, the display panel may include the pixel region including a light-emitting diode.

According to the embodiment of the present disclosure, the optical adhesive member for bonding the display module to the cover window may be further included.

In accordance with the present disclosure, a metal deposition film can be formed on a rear surface and side surfaces of a display module through a sputtering process.

Thus, charges induced in an edge portion can be distributed and discharged along the metal deposition film so that an image quality defect such as a greenish defect due to the introduction of charges can be effectively reduced in an edge portion.

In addition, since the metal deposition film performs a function of dissipating heat, a heat dissipation area can be maximized so that a heat dissipation characteristic can be maximized.

Features, structures, effects, and the like which are described in the examples of the present disclosure are included in at least one example of the present disclosure and are not necessarily limited to only one example. In addition, the features, structures, effects, and the like described in at least one example of the present application disclosure may be combined or modified for other examples by those skilled in the art to which the present disclosure pertains. Therefore, contents related to such a combination and modification should be construed as being included in the scope of the present disclosure.

It should be understood that the embodiments of the present disclosure are not limited to the above described embodiments and the accompanying drawings, and various substitutions, modifications, and alterations can be devised by those skilled in the art without departing from the technical spirit of the present disclosure. Therefore, the scope of the present disclosure is defined by the appended claims, and all alternations or modifications derived from the meaning and scope of the claims and their equivalents should be construed as being included within the scope of the present disclosure.

The invention claimed is:

1. A display device, comprising:
 a cover window;
 a display module including a display panel, the display module having a front surface, a rear surface, and side surfaces, the front surface of the display module facing the cover window; and
 a metal deposition film in contact with the rear surface and the side surfaces of the display module, the metal deposition film being positioned to cover an edge portion of the display module,
 wherein the metal deposition film includes a first metal film including copper and a second metal film on a rear surface of the first metal film, the second metal film including chromium and nickel.

2. The display device of claim 1, wherein the metal deposition film is grounded.

3. The display device of claim 1, wherein the edge portion on at least one side of the display module is bent to a rear side in a round shape.

4. The display device of claim 1, wherein the display module further includes at least one of a touch panel and a polarizing plate which are modularized with the display panel.

5. The display device of claim 1, wherein the display panel includes a pixel region including a light-emitting diode.

6. The display device of claim 1, further comprising:
 an optical adhesive member configured to bond the display module to the cover window.

7. The display device of claim 1, wherein the metal deposition film is a charge shielding layer on the edge portion of the display module configured to shield inflow of charges into the display module.

8. A display device, comprising:
 a cover window;
 a display module including a display panel that is bonded to the cover window at a front side of the display module; and
 a metal deposition film formed on a rear surface and side surfaces of the display module,
 wherein the metal deposition film includes a first metal film including copper,
 wherein the metal deposition film further includes a second metal film including chromium and nickel; and
 wherein the first metal film is located on a surface of the second metal film.

9. The display device of claim 8, wherein a thickness of the first metal film is between 2000 angstroms to 3000 angstroms.

10. A display device, comprising:
 a cover window;
 a display module including a display panel, the display panel being bonded to the cover window at a front side of the display module; and
 a metal deposition film formed on a rear surface and side surfaces of the display module,
 wherein the display module further includes a circuit film connected to the display panel on one of the side surfaces of the display module; and
 wherein the metal deposition film on the one of the side surfaces of the display module includes a hole which exposes a connection portion between the display panel and the circuit film and a peripheral region of the connection portion.

11. A display device, comprising:
 a cover window;
 a display module disposed at a rear portion of the cover window, the display module including a display panel having a back plate; and
 a metal deposition film in contact with a rear surface and a side surface of the back plate of the display panel to shield inflow of charges into the display module,
 wherein the metal deposition film includes a first metal film including copper and a second metal film on a rear surface of the first metal film, the second metal film including chromium and nickel.

12. The display device of claim 11, wherein the metal deposition film is in direct contact with the rear surface and the side surface of the back plate of the display panel.

13. The display device of claim 12, wherein the metal deposition film is a continuous layer on the rear surface and the side surface of the back plate of the display panel of the display module.

14. The display device of claim 11, wherein:
 the display module further includes a circuit film connected to the display panel on one side surface of the display module; and
 the metal deposition film on the one side surface of the display module includes a hole which exposes a connection portion between the display panel and the circuit film and a peripheral region of the connection portion.

15. The display device of claim 11, wherein the metal deposition film is deposited on an edge portion of the display module.

16. The display device of claim 11, wherein the metal deposition film is in contact with both side surfaces of the back plate of the display panel of the display module.

\* \* \* \* \*